United States Patent
Bratfisch et al.

(10) Patent No.: US 6,803,754 B2
(45) Date of Patent: Oct. 12, 2004

(54) POWER SENSOR

(75) Inventors: Toralf Bratfisch, Munich (DE); Arnd Diestelhorst, Munich (DE); Michael Katzer, Munich (DE); Thomas Reichel, Baldham (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 70 days.

(21) Appl. No.: 10/220,422

(22) PCT Filed: Jun. 25, 2001

(86) PCT No.: PCT/EP01/07162
§ 371 (c)(1),
(2), (4) Date: Sep. 3, 2002

(87) PCT Pub. No.: WO02/14880
PCT Pub. Date: Feb. 21, 2002

(65) Prior Publication Data
US 2003/0020492 A1 Jan. 30, 2003

(30) Foreign Application Priority Data
Aug. 14, 2000 (DE) .......................... 100 39 665

(51) Int. Cl.⁷ .......................... G01R 23/04; G01R 15/00
(52) U.S. Cl. .......................... 324/95; 324/132
(58) Field of Search .......................... 324/96, 72.5, 76.14, 324/95, 114, 115, 132; 250/250; 343/703

(56) References Cited

U.S. PATENT DOCUMENTS

| | | | |
|---|---|---|---|
| 544,396 A | 8/1895 | Thomson ..................... 310/267 |
| 3,678,381 A | 7/1972 | Beaudry ..................... 324/95 |
| 4,104,587 A | 8/1978 | Singer et al. ................. 324/95 |
| 4,194,205 A | 3/1980 | Willmore et al. ............ 342/173 |
| 4,873,484 A | * 10/1989 | Adam .......................... 324/95 |
| 4,943,764 A | * 7/1990 | Szente et al. ................. 324/95 |
| 5,204,613 A | 4/1993 | Cripps et al. ................. 324/95 |
| 6,407,540 B1 | * 6/2002 | Shepherd ..................... 324/95 |
| 6,548,999 B2 | * 4/2003 | Wong et al. ................. 324/132 |
| 6,597,228 B1 | 7/2003 | Reichel ....................... 327/330 |

FOREIGN PATENT DOCUMENTS

| | | |
|---|---|---|
| DE | 1 941 341 | 2/1970 |
| DE | 36 44 205 C2 | 7/1988 |
| DE | 40 06 869 A1 | 9/1991 |
| DE | 42 39 740 C1 | 6/1994 |
| DE | 33 29 209 A1 | 10/1994 |
| DE | 199 13 338 A1 | 9/2000 |
| DE | 199 55 342 A1 | 5/2001 |
| EP | 0 398 780 B1 | 1/1994 |
| EP | 0 742 649 A2 | 11/1996 |
| GB | 2 275 392 A | 8/1994 |

OTHER PUBLICATIONS

Anritsu Co., "A Universal Power Sensor", Microwave Journal, Mar. 2000, pp. 130, 132, 134; Morgan Hill, CA.

Hogan, Ron; "Wide–Range Sensor Gauges Power of Complex Signals", Micowaves & RF, Sep. 1999, pp. 128–137.

(List continued on next page.)

Primary Examiner—Donald M. Lair
(74) Attorney, Agent, or Firm—Ditthavong & Carlson, P.C.

(57) ABSTRACT

A power sensor for measuring the average power of modulated or non-modulated high-frequency or microwave signals across a wide dynamic range is disclosed, in which a combination of the following features are used: a) the signal power to be measured is delivered to a first sensor branch for measuring said signal power in a lower power measuring range (−70 to −16 dBm), b) the sensor branch has several spatially separate measuring points on a connecting line between the input and a power splitter connected downstream; and, c) at the same time, the signal power to be measured is delivered to at least two other sensor branches by means of the power splitter with a largely load-independent synchronous output, via attenuators, in order to measure the signal power in at least two other power measuring ranges (−22 to +4 dBm or −2 to +20 dBm).

18 Claims, 2 Drawing Sheets

OTHER PUBLICATIONS

Agilent Technologies, "EPM Series Power Meters E–Series and 8480 Series Power Sensors", pp. 1–21.

Johnson, Russell A., "Understanding Microwave Power Splitters", Microwave Journal, Dec. 1975, USA.

Sucher, Max; "Final Report on High Power Measuring Techniques", Mar. 9, 1959; Microwave Research Institute, Brooklyn, NY.

Webb, Richard C., "Power Divider/Combiners: Small Size, Big Specs", Microwaves, Nov. 1981, pp67–74.

* cited by examiner

POWER SENSOR

FIELD OF THE INVENTION

The invention relates to a power sensor for measuring the average power of modulated or unmodulated radio-frequency or microwave signals over a large dynamic range.

BACKGROUND OF THE INVENTION

A very wide variety of embodiments of power sensors are known. The most common versions contain either a single thermal sensor, which produces an electrical measurement quantity proportional to the electrical power absorbed, or contain a single diode rectifier in a one- or two-way circuit, which delivers an electrical output quantity equivalent to the voltage across the terminating resistor, from which the power to be measured can then be determined. Whereas power sensors with diodes can measure accurately the power of CW signals (unmodulated sine-wave signals) over a range of from −70 dBm to +20 dBm, their use in relation to envelope-modulated signals is restricted to the diode's so-called quadratic characteristic-response region from −70 dBm to approximately −20 dBm. The dynamic range of about 50 dBm which can be achieved here is significantly smaller than in the case of CW signals, and is roughly the same size as in the case of thermal sensors.

In particular, the requirements of the communication standard for the second and third generations of digital mobile telephony have led to the development of a new group of power sensors with a substantially larger dynamic range for modulated signals. In one of these known power sensors, two sensor branches are provided and, specifically, a first sensor branch for measuring in a low power measurement range is provided directly at an input, and a second sensor branch for measuring in a high power measurement range is connected to the input via a special resistor network which serves both as a characteristic impedance-matched termination for the first sensor branch and also to provide the power feed for the second sensor branch (U.S. Pat. No. 4,943,764). In the practical embodiment of this known power sensor, the sensitive input-side sensor branch needs to be turned off when the other sensor branch for the high powers is being used (Hogan, R.: Wide-Range Sensor Gauges Power Of Complex Signals. Microwaves & RF, September 1999, pp. 128–137). The measurement range of the power sensor which is produced is specified as from −60 dBm to +20 dBm, which means that the sensitivity is 10 dB less than is achievable with known power sensors for CW signals (datasheet "EPM Series Power Meters, E-Series and 8480 Series Power Sensors", literature number 5965–6382E from Agilent Technologies). The sensor is available in a 6 GHz version and in an 18 GHz version.

A power sensor with two sensor branches is also already known, which feeds the signal power to be measured via a power splitter into two sensor branches, respectively with different sizes of attenuators, in order to measure the signal power in a lower power range and in a high power range (U.S. Pat. No. 4,873,484). The power splitter used in this case is designed as a so-called three-resistor power splitter (Russel A. Johnson: Understanding Microwave Power Splitters, Microwave Journal Vol. 18, December 1975, pp. 49–56). In such sensors which operate with power splitters, it is also already known to arrange two such three-resistor power splitters (also referred to as resistive power dividers) in cascade, and hence to provide a total of three sensor branches for different power measurement ranges (Anritsu Co.: A Universal Power Sensor. Microwave Journal, March 2000, pp. 130–134). The measurement range specified by the manufacturer for this power sensor is likewise only from J−60 dBm to +20 dBm. The sensor is available only in a 6 GHz version.

Lastly, in the case of power sensors with diodes, it is also already known to use a plurality of diodes connected in series in the same direction as a rectifying element, either in order to reduce the effect of the junction capacitance, which depends on the drive level, on the linearity of the sensor in the case of sensors which are used exclusively for CW signals (U.S. Pat. No. 5,204,613) or, in the case of sensors for modulated signals, in order increase the measurement range of a sensor branch (Hogan, R.: Wide-Range Sensor Gauges Power Of Complex Signals. Microwaves & RF, September 1999, pp. 128–137).

SUMMARY OF THE INVENTION

There is a need to provide a power sensor for measuring the power average value of modulated signals in the frequency range up to 18 GHz or higher, whose sensitivity and dynamic range are greater than in the case of the known solutions and are comparable with the properties of power sensors for CW signals.

This and other needs are addressed by the invention, in which at least three mutually independent sensor branches with correspondingly different power measurement ranges are provided, in order to divide up the required dynamic range of 90 dB so finely that the perturbing effects due to noise or errors, which occur at the measurement-range limits of the individual sensor branches during the RMS value rectification, can be kept sufficiently small. The individual sensor branches preferably contain diode detectors which, in a manner that is known per se, are constructed using a single rectifier diode (one-way rectifier) or two rectifier diodes with different polarities (two-way rectifier) and an associated charging capacitor. In order to achieve the high sensitivity, as in the case of a power sensor for CW signals, a first sensor branch is arranged directly at the input, whereas the other sensor branches are fed with correspondingly divided powers via power splitters and attenuators. The synchronization of the sensor branches as a function of frequency is particularly important in this case, since only with minor frequency-response differences is unproblematic changeover from the measurement results of one branch to those of another branch possible. This is not guaranteed in the case of the known solutions.

According to the invention, the synchronization problem is solved by the fact that the measurement quantity, that is, the wave impinging on the sensor, is sent with the least possible perturbation through the first sensor branch and subsequently is divided between the two other sensor branches by means of a power splitter, with substantially load-independent synchronous response (tracking), and the measurement device in the first sensor branch is to be configured in such a way that its measurement value is representative of the level of the power of the incident wave, irrespective of the matching of the power splitter. To that end, in the first sensor branch, a plurality of voltage taps, each with an allocated detector, are provided at suitable intervals on the feed line to the power splitter, and the sum of the output voltages of the detectors, or of the apparent powers which can be determined therefrom, is formed in a suitable way. The summation reduces the positional dependency of the measurement results, which is due to standing waves on the feed line, so that the power of the incident wave can be measured very accurately because it is being measured substantially independently of the matching of the power splitter and hence frequency-independently (Sucher, M.: Final Report on High Power Measuring Techniques; Microwave Research Institute, Report R-718-59, PIB-646, March 1959). A further advantage of such an arrangement with distributed measurement points is that the perturbations which are generated by the individual detectors partially cancel out one another and hence improve the input-side matching of the power sensor. Although the advantages of the described measurement arrangement are restricted to a frequency band of the order of one to two octaves, it is also expedient to use it in a broadband power sensor with a frequency band extending over several octaves, because perturbations due to mismatching of individual modules do not usually become relevant until the upper two thirds of the specified frequency range.

For symmetrical division of the measurement signal, independently of mismatches at the outputs of the power splitter, there are two viable embodiments of power splitters. The first group comprises those in which a reflected wave, due to mismatching of one output, is reflected back to the same degree as it is transmitted to the other output, expressed by the relationship $s_{22}=s_{32}$ and $s_{33}=s_{23}$ between the s parameters (gate 1: input of the power splitter). The group of this type of power splitters covers an arrangement whose low-frequency equivalent circuit diagram can be represented by one ohmic impedance each between the input and the two outputs, the resistance being equal to the characteristic impedance which is used (resistive power splitter). This arrangement is represented in FIG. 1 and FIG. 2.

Also applicable according to the invention, however, are power splitters which are matched on the output side and have a high degree of isolation between the outputs ($s_{22} \approx 0$, $s_{33} \approx 0$, $|s_{23}| << |s_{21}s_{31}|$ and $|s_{32}| << |s_{31}/s_{21}|$) because, in this case, a reflected wave due to connecting up one output is neither reflected back into this output nor transmitted to the other output, so that the ratio of the extracted powers remains constant. The group of this type of power splitters covers, inter alia, the so-called Wilkinson Divider (Webb, R. C.: Power Divider/Combiners: Small Size, Big Specs; Microwaves, November 1981, pp. 67–74).

Not applicable according to the invention are resistive power splitters whose low-frequency equivalent circuit diagram exhibits three equally large resistors which radiate from a star point and whose resistance is equal to one-third of the characteristic impedance. The fact that, with this type, a reflected wave due to connecting up one output is not reflected back into this output, but it is transmitted to the other output ($s_{22} \approx 0$, $s_{33} \approx 0$, $|s_{23}| \approx 0.25$ and $|s_{32}| \approx 0.25$) leads directly to an asymmetry in the power division. Since mismatching is in turn frequency-dependent, exact synchronization of the two output powers cannot be possible.

From the two outputs of the first power splitter it is possible to feed, via suitably dimensioned attenuators, two sensor branches whose power ranges are correspondingly staggered. It is also possible, however, to provide a further power splitter between the two outputs in the version according to the invention, so as to have three outputs available for a total of four sensor branches, which permits even finer division of the power range (FIG. 2).

In a power sensor according to the invention, it is advantageous not to use individual diodes within a detector, but rather a plurality of diodes connected in series, because it is thereby possible to increase the dynamic range of an individual sensor branch for the measurement of modulated signals. Associated with this is a gain in the spare driving capacity at the upper measurement limit of the power sensor, at the cost of only a comparatively minor loss of sensitivity at the lower measurement limit. Based on a power range of from −70 dBm to +20 dBm for a CW sensor with single diodes, the series connection of two diodes in each case raises the lower measurement limit of the sensor merely by 3 dB (halved sensitivity), whereas the spare driving capacity increases by 6 dB (halved input voltage per diode). With the series connection of 3 diodes, a shift of lower measurement limit by 5 dB and of the upper measurement limit by 10 dB is to be expected, and not until the series connection of 10 diodes is the −60 dBm measurement limit of the known solutions with a plurality of sensor branches reached.

Instead of series-connected diodes, it is also possible to use a circuit according to the commonly assigned German Patent Application 199 13 338, published on Sep. 28, 2000 and having an English-language title of "Multi-path HF diode rectifier circuit with at least one rectifier diode and at least one charging capacitor, uses output from rectifier circuit that is loaded by same relative temperature coefficient resistance of rectifier diode," in order to increase the dynamic range of an individual sensor branch.

It is furthermore advantageous to evaluate the output signals of all the sensor branches at the same time, and to obtain the measurement result in the overlap ranges of two neighboring sensor branches from the output signals of both branches. The simultaneous acquisition and parallel further processing of the output voltages obtained from the rectifiers of the sensor branches is preferably carried out with an arrangement according to the commonly assigned German Patent Application 199 55 342.4 published on May 23, 2001, i.e. the output voltages of the diode rectifiers are converted into a digital value, and each of these digital values is weighted with weighting factors whose ratio is derived from the drive level of at least one of the diode rectifiers. After scaling to a common quantization unit, the digital values weighted in this way are summed to form the actual digital measurement value and then evaluated. In the overlap ranges between two sensor branches, the measurement result is obtained from the output signals of both rectifiers, so that the effects due to noise or errors during the RMS value rectification at the measurement-range limits are averaged out. The measurement inaccuracy is therefore very small overall, and high reproducibility is guaranteed even in the overlap range, because the hysteresis necessary when switching over is not utilized. A high measurement rate is also achieved since a change of range is superfluous.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The invention will be explained in more detail below with the aid of schematic drawings with reference to exemplary embodiments.

DETAILED DESCRIPTION OF THE PREFERRED EMBODIMENT

Figure 1:
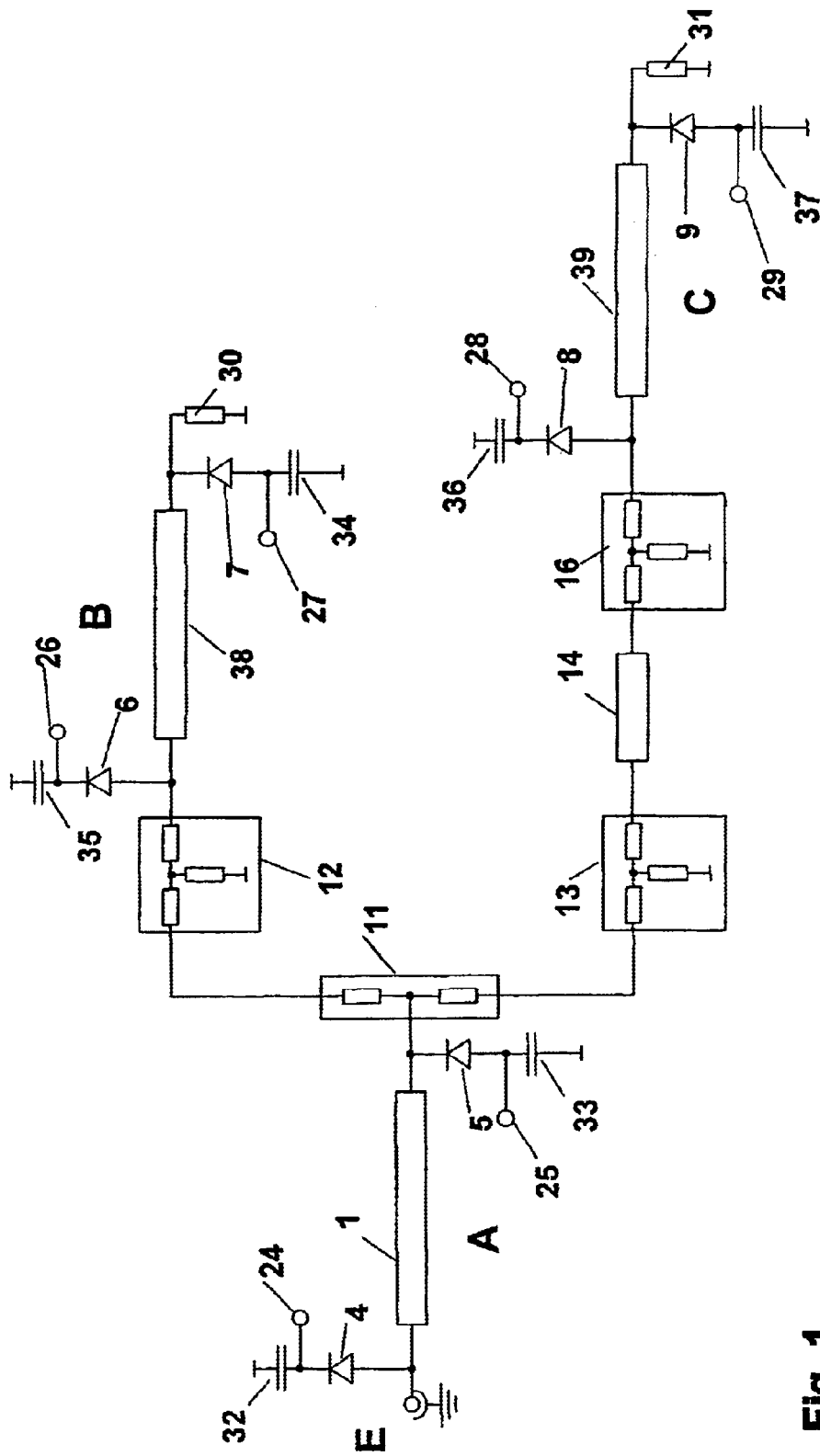
FIG. 1 shows a block diagram of a power sensor.

FIG. 1 shows the block diagram of a power sensor consisting of three sensor branches A, B and C. The input signal fed in at the input E, which is expressed in relation to earth and whose power is to be measured, is firstly fed directly at the input to a first sensor branch A, consisting of the detectors 4 and 5 which are arranged spatially offset; in this first sensor branch A, the signal power is measured in a lower power measurement range of, for example, from −70 to −16 dBm. Between the two detectors 4 and 5, a line 1 is arranged which is dimensioned in such a way that, at the highest measurement frequency of the power sensor, it substantially has the length $\lambda/4$ ($\lambda$=wavelength). Owing to the differences in propagation time, which are associated with the line, for incident and reflected waves, the differential voltage tapped at the measurement-voltage taps 24, 25 as the sum of the output signals of the two detectors is substantially independent of the matching of the subsequent power splitter 11, and therefore remains proportional to the input power throughout the frequency range. Owing to the differences in propagation time produced by the $\lambda/4$ line, the reflections produced by the detectors 4 and 5 are furthermore compensated so that, at least in the upper working-frequency range, a significant improvement in the matching at the input E is achieved.

Instead of two measurement-voltage taps, it could also be possible to use three or more, which, with suitable dimensioning of the line sections connected in-between, would permit an even greater independence from the matching of the power splitter 11 for the power measurement in the most sensitive sensor branch.

After having passed through the first sensor branch, the signal power to be measured is fed directly to a resistive power splitter 11, which is characterized by the s parameters $s_{22}=s_{32}$ and $s_{33}=s_{23}$, and therefore permits symmetrical division of the input power even in the event of mismatching on the output side. The equally large signal-power components produced by the power splitter 11 are fed to the two parallel sensor branches B and C. The two sensor branches B and C have two differently dimensioned attenuation stages 12 and 13, 16, which are dimensioned in such a way that the two detectors 6, 7 and 8, 9 are respectively driven for a different measurement range of the input power. In these measurement ranges, the differential output voltages which can be tapped from the measurement taps 26, 27 and 28, 29, respectively, are proportional to the signal power fed to the input E. The attenuator 12 of the sensor branch B is, for example, dimensioned in such a way that the input-power range −22 to +4 dBm is covered by the detector 6, 7, and the attenuators 13, 16 of the sensor branch C with the detector 8, 9 are dimensioned in such a way that the power range −2 to +20 dBm is covered by this branch. Together with the input-side sensor branch A, a larger dynamic range is hence acquired overall by these three simultaneously acting sensor branches. Between the individual detectors 6, 7 and 8, 9 of these two additional sensor branches B and C formed in this way, it is in turn possible to interpose lines 38 and 39 which reduce the mismatches at the output of the attenuators, and therefore undesired attenuation changes as a function of frequency. The lines 1, 14, 38 and 39 are respectively terminated with their characteristic impedance; the line 1 is terminated by the input impedance of the power splitter 11, the line 14 is terminated by the input impedance of the attenuator 16 and the lines 38 and 39 are terminated by the additional terminating resistors 30, 31.

The attenuation for the sensor branch C is carried out in two stages 13, 16, with an attenuator 13 preferably identical to the attenuator 12 being selected. This preserves the symmetry of the arrangement up until the output of these attenuators, and it is merely furthermore necessary to ensure that the attenuator 16 has a low frequency response of the attenuation. The arrangement with two attenuation stages for the sensor branch C, moreover, also has the further advantage that this sensor branch can be isolated better from the measurement input E. If all of the attenuation for the sensor branch C were to be carried out in the attenuator 13, then the output of this attenuator would carry a level that is reduced by 40 dB in relation to the measurement input, and because of the spatial proximity to the power splitter, this would entail frequency-dependent crosstalk which could not be reduced even by lengthening the line 14. Therefore, the line 14 carries a level which is so great that the crosstalk from the measurement input can be neglected, so that the length of the line 14 can be dimensioned in such a way that the sensor branch C can in turn be arranged far enough away from the measurement input E. Lastly, two attenuation values of the order of 20 dB each can be produced more easily than a single one of the order of 40 dB. The three sensor branches with the detectors are respectively connected directly, without capacitive, inductive or mixed capacitive/inductive coupling elements, to the input E and to the attenuators 12, 16.

All the circuit components of the power sensor, such as power splitters, attenuators and associated connection lines, are configured from radio-frequency technical standpoints. Not only does each power splitter 11 respectively consist of two 50 Ω resistors (for a 50 Ω line system), but also the concomitant distributed capacitances and inductances are selected in proportion to one another such that the s parameters have the characteristic values for such a power splitter over the entire working-frequency range. This means that, with circuit dimensions of the order of the smallest occurring wavelength, it is necessary to comply with very specific requirements in terms of the geometry of the arrangement, and similar considerations apply to the attenuators and the terminating resistors 30, 31, as well as the feed lines and the connecting $\lambda/4$ lines 1, 38 and 39. Constructing the entire circuit in coplanar circuit technology has the advantage that the circuit earth lies in the same plane as the signal conductors, which permits a particularly simple and economical overall construction.

Producing the circuit in coplanar technology also permits the use of thin-film capacitors for the charging capacitances 32 to 37 of the diode rectifiers. Thin-film capacitors are capacitors with an extremely small height dimension, whose bottom electrode is formed by a part of the earth surface of the coplanar line, onto which a thin dielectric (silicon nitride, silicon monoxide, approximately 1 pm thick) is applied, which is in turn provided with a cover electrode.

The great advantage of such thin-film capacitors is that this cover electrode lies virtually the same plane as the earth surfaces and signal lines, and therefore makes it possible to mount components which are equipped with so-called bump contact surfaces in one plane. Such bumps permit very low connection inductances and therefore better radio-frequency response of the rectifiers. Furthermore, the cover electrode which is substantially at earth potential and lies in one plane with the earth surface represents only a minor perturbation for the electric field of neighboring line structures.

In order to increase the range of proportionality between the output voltage and the input power of the rectifiers which are used, beyond the quadratic characteristic-response region, it is advantageous either to provide, in a manner which is known per se, a plurality of diodes connected in series in the same direction instead of a single diode 4, 5, 6, 7, 8 and 9, in which case arranging three such series-connected diodes already permits, for example, a gain of 5 dB in the measurement dynamics, or the rectifiers are designed and dimensioned according to the commonly assigned German Patent Application 199 13 338, which means a gain of approximately 10 dB.

Figure 2:
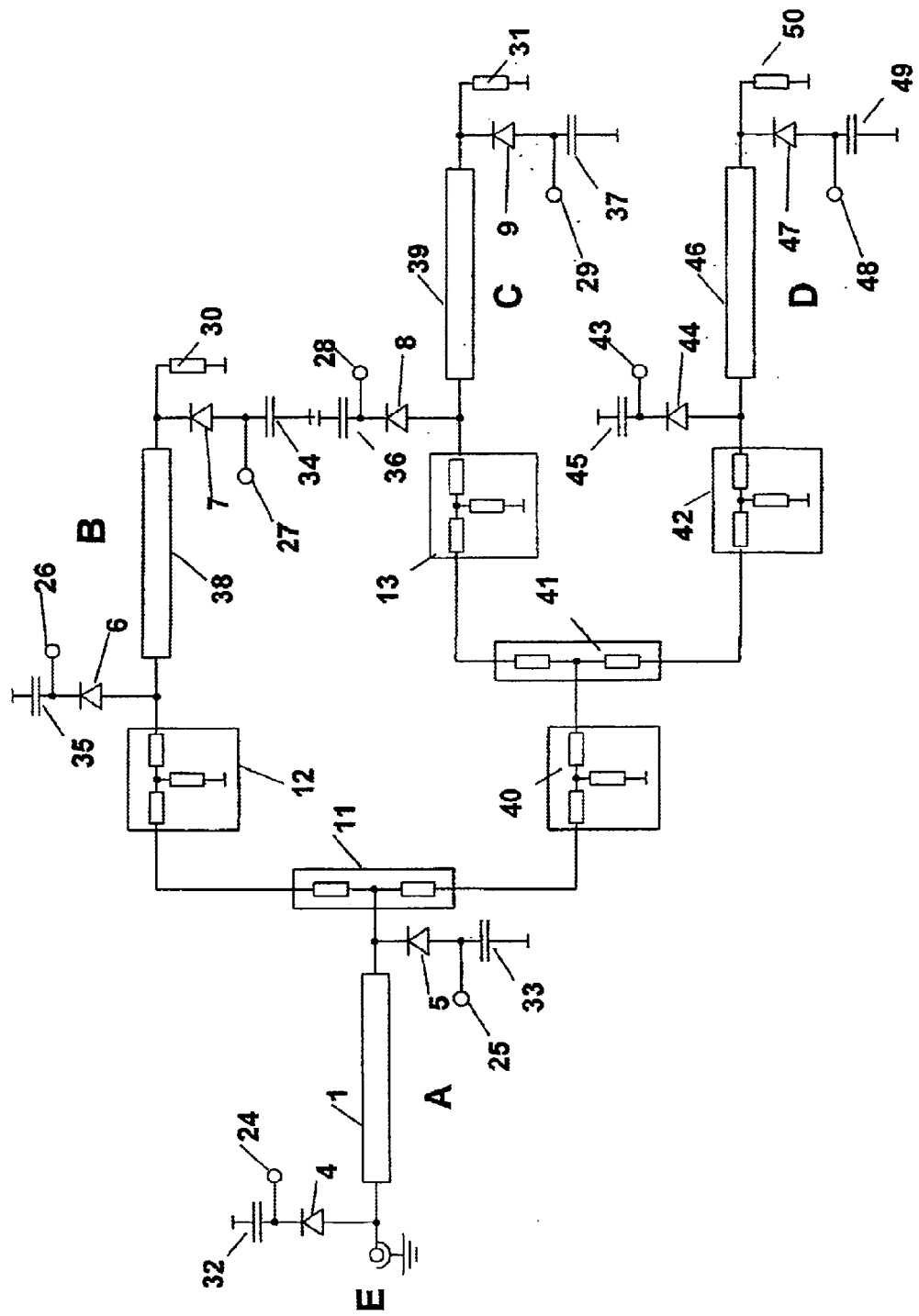
FIG. 2 shows a block diagram of another arrangement for a power sensor.

Even finer subdivision of the power measurement ranges is possible if, according to FIG. 2, a plurality of power splitters are arranged behind one another in cascade. Owing to the two power splitters 11 and 41 connected in cascade, four sensor branches A, B, C and D are provided in total, the branches A, B and C corresponding to those according to FIG. 1. By the second power splitter 41, to which a part of the power is fed from one of the branches of the first power splitter 11 via an attenuator 40, this power is divided up between the sensor branch C and the fourth sensor branch D, which in turn has an attenuator 42, a detector 44, 47 with, arranged in-between, a delay line 46 and an associated terminating resistor 50, and whose measurement outputs 43, 48 are in turn connected to the common digital evaluation instrument. The four sensor branches provided in this way can be staggered more finely in terms of their usable power range, which leads to an even better signal-to-noise ratio in the overlap range and therefore to a likewise lower measurement inaccuracy, or a higher measurement rate. Of the in total three additional attenuators 13, 40 and 42, not all three are necessarily indispensable, and one of these attenuators may actually be left out if the configuration is appropriate.

Another possible way of increasing the number of sensor branches is, in FIG. 2, also to divide the sensor branch B into two further sensor branches by a further power splitter, so as to provide a total of five sensor branches, or to divide one of the already subdivided sensor branches C or D in turn, by a further power splitter arranged in cascade with the power splitter 41, into a plurality of individual sensor branches. In this way, it is possible to produce arbitrarily many sensor branches, although the gain achieved thereby needs to be weighed up against the higher circuit outlay and possible synchronization problems.

While the present invention has been described in connection with a number of embodiments and implementations, the present invention is not so limited but covers various obvious modifications and equivalent arrangements, which fall within the purview of the appended claims.

What is claimed is:

1. A power sensor for measuring an average power of a radio-frequency or microwave signal over a large dynamic range, comprising:
   a first sensor branch for measuring a signal power fed at an input in a lower power measurement range, said first sensor branch having a plurality of mutually spatially separated measurement points on a connection line between the input and a power splitter, and
   at least two further sensor branches for measuring the signal power fed thereto concurrently, with a substantially load-independent synchronous response, via the power splitter and attenuators in at least two further different power measurement ranges.

2. A power sensor according to claim 1, wherein:
   the at least two further different power measurement ranges include a medium power measurement range and a high measurement range.

3. A power sensor according to claim 1, wherein:
   the at least two further different power measurement ranges includes three further different power measurement ranges.

4. A power sensor according to claims 1, wherein:
   a resistive power splitter with $s_{22}=s_{32}$ and $s_{33}=s_{23}$ is used as the power splitter.

5. A power sensor according to claim 1, wherein:
   the sensor branches respectively have diode rectifiers.

6. A power sensor according to claim 5, wherein:
   at least one of the diode rectifiers is designed as a two-way rectifier.

7. A power sensor according to claim 6, further comprising:
   delay lines, respectively terminated with a characteristic impedance, and arranged between two rectifier branches of two-way rectifiers in the further sensor branches.

8. A power sensor according to claim 5, wherein:
   at least one of the diode rectifiers includes a charging capacitor.

9. A power sensor according to claim 5, wherein:
   at least one of the diode rectifiers comprises a series connection of a plurality of diodes arranged in a same direction.

10. A power sensor according to claim 1, wherein:
    the signal input and at least one of the sensor branches is designed in coplanar line technology.

11. A power sensor according to claim 1 for measuring an average power of a radio-frequency or microwave signal over a large dynamic range, comprising:
    a first sensor branch for measuring a signal power fed thereto in a lower power measurement range, said first sensor branch having a plurality of mutually spatially separated measurement points on a connection line between an input and a power splitter, and
    at least two further sensor branches for measuring the signal power fed thereto concurrently, with a substantially load-independent synchronous response, via the power splitter and attenuators in at least two further different power measurement ranges, wherein:
    output signals of diode rectifiers of the sensor branches are processed further in a digital evaluation circuit for digitizing the weighting the digitized output signals with weighting factors having a ratio derived from a drive level of at least one of the diode rectifiers.

12. A power sensor according to claim 11, wherein:
    a measurement result is output in digital form.

13. A power sensor according to claim 1, wherein:
    components of the power sensor are built into a measurement head.

14. A power sensor according to claim 1, wherein:
    the lower power measurement range is from −70 to −16 dBm,
    one of the at least two further different measurement ranges is from −22 to +4 dBm, and
    another of the at least two further different measurement ranges is from −2 to +20 dBm.

15. A power sensor according to claim 1, wherein a power divider is not disposed between the input measurement points on the connection line.

16. A power sensor according to claim 1, further comprising a plurality of diode detectors disposed respectively at the measurement points.

17. A power sensor for measuring an average power of a radio-frequency or microwave signal over a large dynamic range, comprising:
- a first sensor branch for measuring a signal power fed thereto in a lower power measurement range, said first sensor branch having a plurality of mutually spatially separated measurement points on a connection line between an input and a power splitter, and
- at least two further sensor branches for measuring the signal power fed thereto concurrently, with a substantially load-independent synchronous response, via the power splitter and attenuators in at least two further different power measurement ranges, wherein:
- at least the first sensor branch comprises two measurement points at a separation of approximately one quarter of the wavelength of the highest occurring frequency.

18. A power sensor for measuring an average power of a radio-frequency or microwave signal over a large dynamic range, comprising:
- a first sensor branch for measuring a signal power fed thereto in a lower power measurement range, said first sensor branch having a plurality of mutually spatially separated measurement points on a connection line between an input and a power splitter, and
- at least two further sensor branches for measuring signal power fed thereto concurrently, with a substantially load-independent synchronous responses, via the power splitter and attenuators in at least two further different power measurement ranges, wherein:
- the signal input and at least one of the measurement branches is designed in coplanar line technology, and
- charging capacitances of the at least one measurement branches designed in coplanar line technology are designed as thin-film capacitors.

* * * * *